United States Patent [19]

Sakai

[11] Patent Number: 5,318,944
[45] Date of Patent: Jun. 7, 1994

[54] IMAGE RECEIVING SHEET

[75] Inventor: Jun Sakai, Nagoya, Japan

[73] Assignee: Brother Kogyo Kabushiki Kaisha, Nagoya, Japan

[21] Appl. No.: 945,264

[22] Filed: Sep. 15, 1992

[30] Foreign Application Priority Data

Oct. 2, 1991 [JP] Japan .................. 3-255311

[51] Int. Cl.$^5$ .................. B41M 5/035; B41M 5/38
[52] U.S. Cl. .................. 503/227; 428/195; 428/206; 428/209; 428/210; 428/327; 428/341; 428/913; 428/914
[58] Field of Search ............ 503/227; 428/195, 206, 428/323, 913, 914, 209, 210, 327, 341

[56] References Cited

U.S. PATENT DOCUMENTS

| | | | |
|---|---|---|---|
| 2,548,366 | 4/1951 | Green et al. | 282/28 |
| 3,775,424 | 11/1973 | Farber | 260/295 B |
| 3,864,400 | 2/1975 | Seibert | 260/570 D |
| 4,399,209 | 8/1983 | Sanders et al. | 430/138 |
| 4,416,966 | 11/1983 | Sanders et al. | 430/138 |
| 4,440,846 | 4/1984 | Sanders et al. | 430/138 |
| 4,554,235 | 11/1985 | Adair et al. | 430/138 |
| 4,576,891 | 3/1986 | Adair et al. | 430/138 |
| 4,587,194 | 5/1986 | Adair et al. | 430/138 |
| 4,764,451 | 8/1988 | Ishikawa | 430/138 |
| 4,784,932 | 11/1988 | Nakamura et al. | 430/203 |
| 5,039,589 | 8/1991 | Takahashi | 430/138 |

FOREIGN PATENT DOCUMENTS

| | | | |
|---|---|---|---|
| 48-95420 | 12/1973 | Japan | 503/227 |
| 57-124343 | 8/1982 | Japan . | |
| 57-179836 | 11/1982 | Japan . | |
| 57-197538 | 12/1982 | Japan . | |
| 61-275742 | 12/1986 | Japan . | |
| 62-66997 | 3/1987 | Japan | 503/227 |
| 62-174195 | 7/1987 | Japan . | |
| 62-209444 | 9/1987 | Japan . | |

Primary Examiner—Pamela R. Schwartz
Attorney, Agent, or Firm—Oliff & Berridge

[57] ABSTRACT

The invention relates to an image receiving sheet which is a retransfer sheet for forming an image on an optional transferred medium The image receiving sheet comprises a support member, a transparent layer and a thermoplastic fine particles layer Light having an image information is irradiated toward a photosensitive recording medium having microcapsules which change their hardness by being exposed to one of heat or light. Then, a chemical latent image corresponding to the image is represented by the microcapsules having different hardness. When the photosensitive recording medium and the image receiving sheet are superposed and pressed against each other, the unhardened microcapsules are ruptured and the pigment or dye in the unhardened microcapsules flows from the ruptured microcapsules. The pigment or dye that flows from the microcapsules is absorbed into the thermoplastic fine particles layer. As a result, a visible image corresponding to the image is formed on the image receiving sheet. The image receiving sheet is placed on the transferred medium and they are thermally pressed against each other. When the support member is peeled off, the image covered with the transparent layer remains as a transfer on the transferred medium.

12 Claims, 3 Drawing Sheets

IMAGE RECEIVING SHEET

BACKGROUND OF THE INVENTION

1. Filed of the Invention

The invention relates to an image receiving sheet for forming an image thereon when the image receiving sheet is closely held against a photosensitive recording medium and is pressed thereto, and for transferring the image thus transferred on the image receiving sheet onto an optional image receiving medium.

2. Description of Related Art

Conventionally, there is an image recording method which is disclosed in Japanese Laid-Open Patent Publication No. 61-275742. In the image recording method, a plurality of microcapsules each encapsulating therein not only color forming material made from dye or pigment but also, at least, silver halide, reducing agent, and polymerizable compound, are employed. More specifically, a photosensitive recording medium having a base sheet with the microcapsules uniformly coated thereon is used. When each of the microcapsules is exposed to light, the microcapsule forms an latent image speck therein. Therefore, when the light having an image information selectively exposes the photosensitive recording medium, some of the microcapsules are exposed and others are not exposed. The exposed microcapsules each form the latent image speck therein. Each of the microcapsules having the latent image speck is hardened by heat. However, each of the microcapsules which does not form the latent image speck therein is not hardened by heat. Thus, a first latent image is formed on the photosensitive recording medium. In other words, the first latent image is represented by microcapsules having the latent image speck therein and the microcapsules having no latent image speck therein.

Next, the photosensitive recording medium, which was exposed to the light having the image information, is heated by a heating device. The microcapsules having the latent image speck therein are hardened and a second latent image is thereby formed on the photosensitive recording medium. In other words, the second latent image is represented by the hardened microcapsules and the unhardened microcapsules. After this, the photosensitive recording medium is superposed on the image receiving sheet and is pressed thereto The unhardened microcapsules are ruptured and the color forming materials, made from dye or pigment, flow out of each of the ruptured microcapsules and are transferred onto the image receiving sheet. As a result, an image is formed on the image receiving sheet. The above-mentioned conventional image recording method is therefore capable of performing a highly-sensitive image recording operation of a dry type for recording a desired image on the image receiving sheet.

However, with the above-mentioned conventional image forming method, it is impossible to transfer the image onto an optional article having an arbitrary shape. For example, it is impossible to transfer the image onto cloth having a size that is too large to be introduced into a pressing device for pressing the photosensitive image recording medium toward the cloth.

To address the above-mentioned problem, an applicant of the present invention previously proposed an image receiving sheet 23 in the specifications and drawings of U.S. patent application Ser. No. 07/911,978, filed Jul. 10, 1992. As shown in FIG. 6, the proposed image receiving sheet 23 includes a support member 20 and a porous absorbing layer 22 provided thereon. The porous absorbing layer 22 contains fine particles 21 having a heat-meltable or thermoplastic property.

Hereinafter, a method of forming an image on an optional transferred medium having an arbitrary shape with the image receiving sheet 23 and the photosensitive recording medium will be explained.

First, as described above, the photosensitive recording medium which is exposed to the light, having the image formation, is then heated by the heating device. Then, the second latent image bearing surface of the photosensitive recording medium, that is, the microcapsules side thereof is superposed on and pressed toward the porous absorbing layer 22 of the image receiving sheet 23 so that the unhardened microcapsules are ruptured. The dye or the pigment flows from the ruptured microcapsules. The dye or the pigment from the ruptured microcapsules is absorbed in spaces between the fine particles 21 and held therein. As a result, the image is formed on the porous absorbing layer 22.

Next, the image receiving sheet 23 is peeled from the photosensitive recording medium. Further, the image receiving sheet 23, having the porous absorbing layer 22 thereon, is placed, face down, on the optional transferred medium. The image receiving sheet 23 is pressed toward the transferred medium and, further, heated by an iron or other heat source. Thus, the porous absorbing layer 22 is melted onto the optional transferred medium and attaches thereto. Finally, the supporting layer 20 of the image receiving sheet 23 is peeled off so that the image (re-transferred image) is left formed on the transferred medium.

The retransferred image formed by the transferring method using the above-mentioned image receiving sheet 23, contains a polymerizable compound which is a stimulus to the skin, such as TMPTA [trimethylolpropane triacrylate]. Therefore, there is a fear that some persons may have a reaction, such as itchy skin, when they touch the surface of the retransferred image.

SUMMARY OF THE INVENTION

It is therefore an object of the invention to provide an image receiving sheet capable of forming a retransferred image on the optional transferred medium without serving as a stimulus to the skin.

To achieve the object, the image receiving sheet of the invention comprises a support member, a transparent layer provided on the support member and a thermoplastic fine particles layer coated on the transparent layer.

After the second latent image is formed on a photosensitive recording medium, the thermoplastic fine particle layer side of the image receiving sheet of the invention is closely held against the microcapsule side of the photosensitive recording medium and is pressed thereto. Then, the color forming materials flowing from the ruptured microcapsules are absorbed into spaces between the fine particles and are held therein. Next, the thermoplastic fine particles layer side of the image receiving sheet is superposed on a transferred medium and is heated and pressed toward the transferred medium by a hot press, an iron, or other heat source. Then, the thermoplastic fine particles bearing on the image receiving sheet are thermally melted, or softened, so that the image receiving sheet is attached onto the transferred medium. After this, the support member of the image receiving sheet is peeled off and as a result, the image which is covered with the transparent layer is retransferred on the retransferred medium. Therefore, since the transparent layer covers the surface of the retransferred image, there is no fear that the skin directly touches the retransferred image containing the polymerizable material. Therefore, there is no fear that some persons will suffer a rash or itchiness of the skin even if they touch the surface of the retransferred image.

BRIEF DESCRIPTION OF THE DRAWINGS

A preferred embodiment of the invention will be described in detail with reference to the following figures wherein.

DETAILED DESCRIPTION OF THE PREFERRED EMBODIMENT

Figure 1:
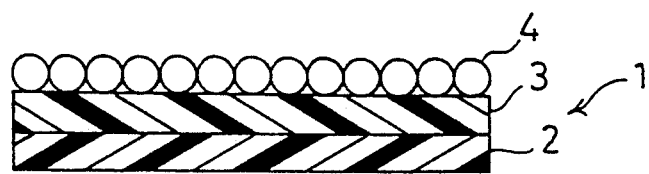
FIG. 1 is a longitudinal sectional view of an image receiving sheet of the invention.

Hereinafter, one embodiment which embodies the invention will be explained with reference to the figures. The structure of an image receiving sheet of the present embodiment will be explained with reference to FIG. 1. The image receiving sheet 1 comprises a support member 2, a transparent layer 3 and a thermoplastic fine particles 4 layer. The transparent layer 3 is disposed on the support member 2 and the thermoplastic fine particles 4 layer is coated on the transparent layer 3.

Representative examples of the support member 2 include glass, paper, metal film, polyethylene terephthalate, polyvinyl chloride, polyethylene, polypropylene, polystyrene, resin film such as cellulose ester, and paper laminated with resin material. However, any material can be used for the support member 2 if the material can be formed so as to be a thin film.

The composition of the transparent layer 3 includes a resin with high transparency, glass, metal film, and metal oxide thin film. Preferably, it is a resin material which is not distorted easily. Representative examples of the composition of the transparent layer 3 include simple substances such as polyester, polyethylene, polypropylene, polystyrene, polyvinyl acetate, polyvinyl chloride, polyethyl methacrylate, and polyamide, or copolymers such as ethylene-vinyl-acetate copolymer, styrene-acryl copolymer, ethylene-ethylacrylate copolymer, and ethylene-acrylic acid copolymer, ionomer.

The composition of the thermoplastic fine particles 4 preferably has the property that it is melted or softened at a temperature in the range from 50° to 200 ° C. to form a film. Representative examples of the composition of the fine particles 4 include: single substances such as polyethylene, polypropylene, polystyrene, polyvinyl acetate, polyvinyl chloride, polyethyl methacrylate, and wax and copolymers such as ethylene-propylene copolymer, ethylene-vinyl-acetate copolymer, ethylene-ethylacrylate copolymer, ethylene-acrylic acid copolymer, ionomer, styrene-methacrylic acid ethylene copolymer, styrene-butadiene copolymer, and styrene-acryl copolymer. The mean value of the particle diameter of the thermoplastic fine particles 4 is equal to or greater than 0.1 micrometers and, more preferably, is in a range from 0.5 to 20 micrometers.

To coat the above-mentioned thermoplastic fine particles 4 onto the transparent layer 3 to form the thermoplastic fine particles 4 layer, a coating liquid comprising a dispersal medium with the thermoplastic fine particles 4 dispersed or suspended therein is coated on the transparent layer 3. After coating, the coating liquid is dried. As the coating liquid to which the thermoplastic fine particles 4 are added, water is preferable. A small amount of binder such as starch, casein, polyvinyl alcohol, or styrene-butasiene latex may be added to the water. For example, the binder in an amount in the range from 5 to 15 grams may be added to the water, in which thermoplastic fine particles 4 of an amount of 95 to 85 grams are added. The coating amount of the thermoplastic fine particles 4 coated onto the transparent layer 3 is preferably in a range of 1 to 10 g/m² under dried conditions.

Adhesion between the support member 2 and the transparent layer 3 is defined as F1. Adhesion between the transparent layer 3 and the thermoplastic fine particles 4 layer is defined as F2. Adhesion between the thermoplastic fine particles 4 layer and a transferred medium 10 is defined as F3. There needs to be a relationship between F1, F2 and F3. That is, after the image receiving sheet 1 is superposed on the transferred medium 10, the image receiving sheet 1 is heated and is pressed toward the transferred medium 10 and just before the support member 2 is peeled away, F1 is less than both; F2 and F3. The above-mentioned representative examples of support member 2, transparent layer 3 and the thermoplastic fine particles 4 are suitably combined so as to give the above-mentioned relationship among F1, F2 and F3.

The methods of coating the above-mentioned resin material on the support member 2 to form the transparent layer 3. thereon are described below. However, these methods are but examples, and the invention is not limited to the following methods.

(1) According to the first method, the resin material for the transparent layer 3 is dissolved in a suitable organic solvent to form the coating liquid, the coating liquid is coated on the support member 2 and is dried.

(2) According to the second method, the resin material is dispersed in a liquid, such as water, the liquid containing uniformly dispersed resin material for making up the transparent layer 3 which is coated on the support member 2 and the dispersion liquid is subsequently heated so as to be dried.

(3) According to the third method, resin material for the transparent layer 3 is heated so as to be melted and softened. The melted resin material is applied a pressure in a pushing out device (Die) so as to be extruded from a slit of the pushing out device to be coated on the support member 2. The resin material is then allowed to cool on the support member 2.

Next, a method of retransferring an image using an image receiving sheet 1 having the above-mentioned structure will be explained with reference to FIGS. 2-4.

Just as discussed in the Description of the Related Art, the invention employs a photosensitive recording medium As described, the photosensitive recording medium 5 comprises a base sheet 15 and microcapsules 9 each encapsulating therein not only color forming material, made from dye or pigment, but also, at least, silver halide, reducing agent, and a polymerizable compound. The microcapsules 9 are uniformly coated on the base sheet 15. When the microcapsules 9 are selectively exposed to light, the exposed microcapsules 9 each form the latent image speck therein. Each of the microcapsules 8 having the latent image speck therein has the property that it is hardened by heat. However, each of the microcapsules 9 that does not have the latent image speck is not hardened by heat.

Figure 2:
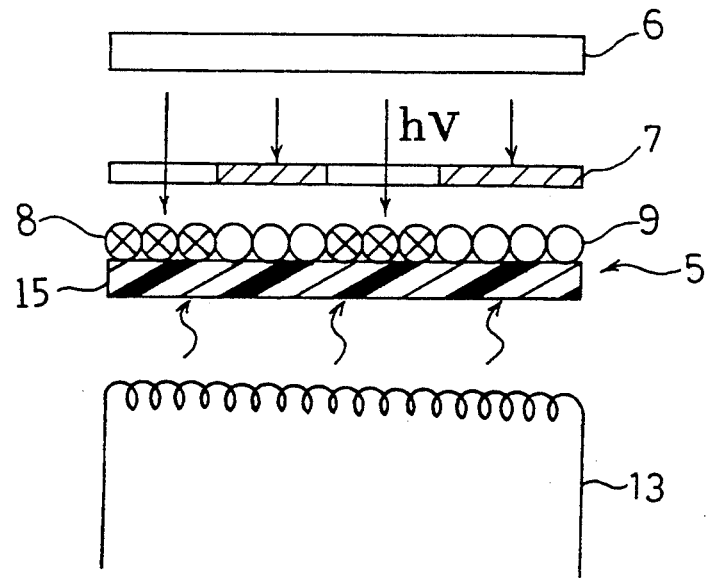
FIG. 2 shows the exposing process for forming first latent image on a photosensitive recording medium and a heating process for forming a second latent image on the photosensitive recording medium with the image forming method of the invention.

Thus, as shown in FIG. 2, a mask or transparency 7 is placed over the photosensitive recording medium 5. The mask 7 is made of a film through which light can pass and on which images have been previously recorded. The light can not pass through the mask 7 at the area of the images but can pass through the mask 7 positioned at the non-image areas.

When a lamp 6 disposed above the mask 7 is lit, the light passes through the mask 7 where there are no images and reaches the photosensitive recording medium 5. The light which reaches the photosensitive recording medium 5 exposes the microcapsules 9. The exposed microcapsules 9 each form the latent image speck therein. The microcapsules having the latent image speck therein become the microcapsules 8 that will be hardened by an application of heat. On the other hand, as described above, the light cannot pass through the mask 7 where there are recorded images. Therefore, the light irradiated onto the mask 7 at points where images are recorded cannot reach the photosensitive recording medium 5 and the microcapsules 9 positioned under the images recorded on the mask 7 are not exposed to light. Those microcapsules 9 do not, therefore, form the latent image speck therein. The microcapsules 9 that do not have the latent image speck therein do not become the microcapsules 8. In such a manner, as described in the Description of the Related Art, a first latent image is formed on the photosensitive recording medium 5. The first latent image is represented by the microcapsules having the latent image speck therein and the microcapsules having no latent image speck therein. After this, when a heater 13 uniformly heats the photosensitive recording medium 5, the microcapsules 8 having the latent image speck therein are hardened due to polymerization of the materials encapsulated in the microcapsules 8. On the other hand, the microcapsules 9 which were not exposed to the light, that is, the microcapsules 9 which do not have latent image speck therein, remain soft even though heated. Thus, a second latent image is formed on the photosensitive recording medium 5. The second latent image is represented by the hardened microcapsules and the unhardened microcapsules.

Figure 3:
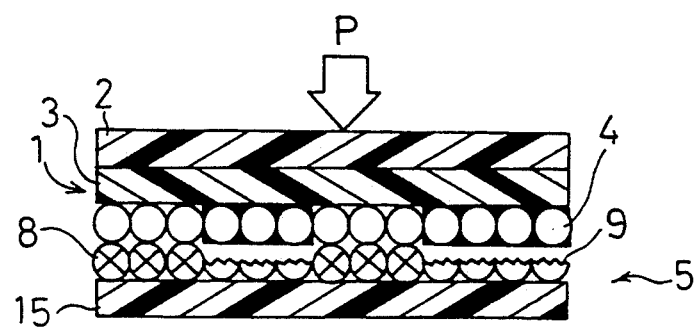
FIG. 3 is shows the transferring development process with the image forming method of the invention.

Next, as shown in FIG. 3, after the photosensitive recording medium 5 is exposed to light and heated, the microcapsule side of the photosensitive recording medium 5 is placed in face to face contact with the thermoplastic fine particles side of the image receiving sheet 1 and the photosensitive recording medium 5 and the image receiving sheet 1 are pressed toward each other by a pressing device (not shown). At this time, the hardened microcapsules 8 do not rupture, and the microcapsules 9, which have not been exposed to light, rupture. The materials, such as pigment or dye and the polymerizable material encapsulated in the unhardened microcapsules 9 flow from the ruptured microcapsules. The materials flowing from the ruptured microcapsules are transferred onto the image receiving sheet 1. The transferred materials are immediately absorbed in the small spaces between the thermoplastic fine particles 4 and held therein. As result of this process, an image corresponding to the image printed on the mask 7 is formed on the image receiving sheet 1 as a visible image. After this, the photosensitive recording medium 5 is peeled away from the image receiving sheet 1.

Figure 4:
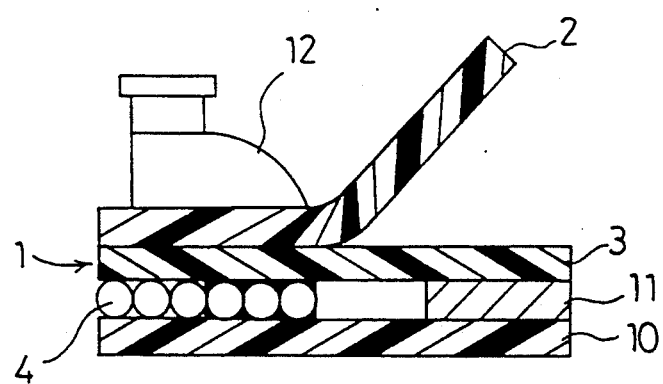
FIG. 4 shows the process of the image forming method of the invention in which the image formed on the image receiving sheet is retransferred to a transferred medium.

Next, as shown in FIG. 4, the image receiving sheet 1, having the image thereon, is superposed on the optional transferred medium 10 and is heated by the heating device 12 such as iron. At this time, it is preferable that the image receiving sheet be pressed toward the transferred medium 10. The image receiving sheet 1 is put on the transferred medium 10 facing down such that the thermoplastic fine particles 4 layer, on which the image is formed, is in face to face contact with the transferred medium 10. Therefore, when the image receiving sheet 1 is heated and pressed toward the transferred medium 10, the thermoplastic fine particles 4 layer melts and is changed into a film. As a result, the film of the thermoplastic fine particles 4 is attached onto the transferred medium 10. After this, the support member 2 is peeled from the image receiving sheet 1.

As described above, adhesion between the support member 2 and the transparent layer 3 is defined as F1. Adhesion between the transparent layer 3 and the thermoplastic fine particles 4 layer is defined as F2. Adhesion between the thermoplastic fine particles 4 layer and the transferred medium 10 is defined as F3. The following relationship among F1, F2 and F3 is needed in order for the transfer to work. F1 must be less than both F2 and F3 so that the support member 2 peels from the transparent layer 3 of the image receiving sheet 1 without fail. Only support member 2 can peel from the image receiving sheet 1 if a good image is to be retransferred.

Thus, an image layer 11 having a film shape and the transparent layer 3 to cover the image layer 11 are transferred and attached onto the transferred medium 10. The image layer 11 is made when the thermoplastic fine particles 4 of a polymerizable material are melted and softened to be changed into a film shape.

Hereinafter, an example of the invention will be described.

The support member 2 is made of polyester film having 75 $\mu m$ thickness, the transparent layer 3 consists of ethylene-vinyl acetate copolymer (at 55 percent VAC (vinyl acetate) and the softening point thereof is 80° C.). Ethylene-vinyl acetate copolymer is coated, to 30 $\mu m$ thickness, on the polyester film support member 2 using the third method of extruding the transparent layer 3. Thus, the transparent layer 3 is formed on the support member 2.

A styrene-acryl copolymer emulsion of 30 weight % (solid content) is prepared. The styrene-acryl copolymer emulsion has a mean value of particle diameter of 1.0 micrometer and has a softening point of 80° C. An aqueous solution of polyvinyl alcohol of 5 weight %, having a saponification value of 97, is also prepared. 30 grams of aqueous solution including polyvinyl alcohol and 100 grams of styrene-acryl copolymer emulsion are added to each other, and are stirred or agitated so that a coating liquid is prepared. The coating liquid is coated, with the used of a bar coater, on the surface of transparent layer 3, which is formed on the polyester film, so that the coating amount of the coating liquid provided on the transparent layer 3 is 7 g/m². The polyester film coated with the coating liquid is then heated, at a temperature of 50° C., for 60 seconds in a clean oven. The result is an image receiving sheet 1 having the thermoplastic fine particles 4 layer formed on the transparent layer 3.

The photosensitive recording medium 5 having been exposed to the light through the mask 7 is heated so that the second latent image is formed on the photosensitive recording medium 5. Then, the photosensitive recording medium 5 and the image receiving sheet are pressed against each other at a pressure of 200 kg/cm² by the pressing device. The, unhardened microcapsules 9 are ruptured and pigment or dye and polymerizable material, in the unhardened microcapsules 9, flows from the ruptured microcapsules. The materials flowing from the ruptured microcapsules are absorbed in the spaces between the thermoplastic fine particles 4 and held therein. As a result, a visible mirror image of the original image is formed on the image receiving sheet 1.

The image receiving sheet 1, having the visible mirror image, is superposed on a transferred medium, such as a cloth (cotton velvet #200). The image receiving sheet 1 and the transferred member are thermally pressed together with the use of a hot press at a temperature of 120° C. for 15 seconds. After this, when the polyester film, which is the support member 2, is peeled from the image receiving sheet 1, the image, which is covered with the transparent layer 3, remains having been retransferred onto the cloth.

In this case, as described above, adhesion between the support member 2 and the transparent layer 3 is defined as F1, adhesion between the transparent layer 3 and the thermoplastic fine particles 4 layer is defined as F2, and adhesion between the thermoplastic fine particles 4 layer and a transferred medium 10 is defined as F3. The following relationship among F1, F2 and F3 must exist. F1 must be less than both F2 and F3. Therefore, the support member 2 can be peeled off from the transparent layer 3 of the image receiving sheet without separating the thermoplastics fine particles 4 layer and transparent layer 3 from the transfer medium 10.

As mentioned above, by employing the image receiving sheet 1 of the invention, since the surface of the retransferred image is covered with the transparent layer 3, there is no fear that the skin directly touches the retransferred image containing polymerizable material. Thus, there is no fear that sensitive persons will develop a rash or itchy skin even if they touch the surface of the retransferred image.

This invention is not limited to the above-mentioned embodiment. It should be understood that many changes and modifications may be made in the embodiment without departing from the scope of the invention.

For instance, the materials for the image receiving sheet 1 are not limited to the materials in the above-mentioned example.

Moreover, in the embodiment, a photosensitive recording medium comprising the microcapsules which are hardened by heat after being exposed to light is employed. However, it may be that a photosensitive recording medium comprising microcapsules, each encapsulating pigment or dye, that are hardened by being exposed to the light are used.

Further, in the embodiment, the photosensitive recording medium comprises microcapsules which are hardened by heat after being exposed to light. It may be that a photosensitive recording medium comprising microcapsules which are softened by heat, after being exposed to light are used. In this case, the image to be formed on the transferred medium is a negative type, or reversed, image of the image formed on the mask 7.

Figure 5:
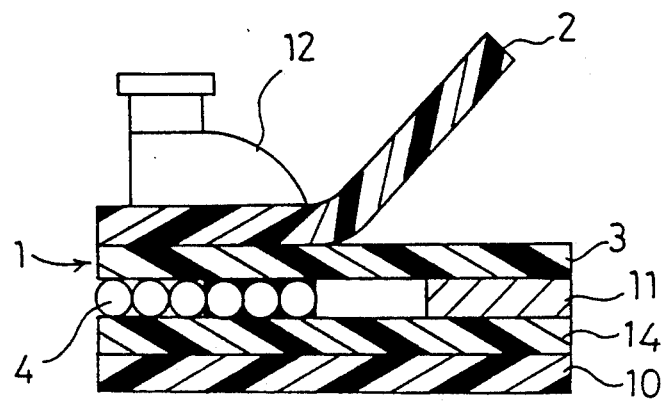
FIG. 5 shows the process of an another image recording method of the invention in which the image on the image receiving sheet is retransferred onto the transferred medium.
Figure 6:
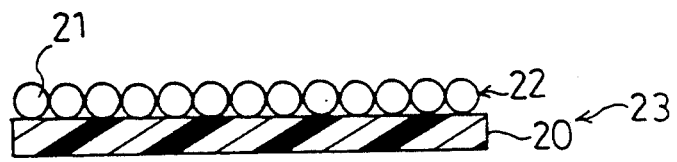
FIG. 6 is a view showing the structure of a conventional image receiving sheet.

Further, as shown in FIG. 5, it may be that another sheet 14, of the same materials as the materials of the transparent layer 3, is inserted between the transferred medium 10 and the thermoplastic fine particles 4 layer when the image receiving sheet 1 and the transferred medium 10 are superposed and pressed against each other. Since the sheet 14 is a slightly melted by heat, the sheet 14 is attached onto the transferred medium 10. In this case, since the image layer 11 is sandwiched between the sheet 14 and the transparent layer 3, the cover effect of the image layer 11 is increased. Further, a sheet 14 may be used that has a lower melting point than that of the transparent layer 3. In this case, the sheet 14 is melted by heat and attached more tightly onto the transferred medium 10.

What is claimed is:

1. An image receiving sheet, comprising:
   a support member;
   a transparent layer provided on said support member; and
   a thermoplastic fine particle layer provided on said transparent layer.

2. The image receiving sheet according to claim 1, wherein said support member comprises a thin film.

3. The image receiving sheet according to claim 2, wherein said support member comprises glass, paper, metal film, polyethylene terephthalate, polyvinyl chloride, polyethylene, polypropylene, polystyrene, resin film or paper laminated with a resin material.

4. The image receiving sheet according to claim 1, wherein said transparent layer member comprises a resin with high transparency, glass, metal film, or metal oxide thin film.

5. The image receiving sheet according to claim 4, wherein said resin with high transparency comprises polyester, polyethylene, polypropylene, polystyrene, polyvinyl acetate, polyvinyl chloride, polyethyl methacrylate, polyamide, ethylene-vinyl-acetate copolymer, styrene-acryl copolymer, ethylene-ethylacrylate copolymer, ethylene-acrylic acid copolymer or ionomer.

6. The image receiving sheet according to claim 1, wherein said thermoplastic fine particles form a film when melted or softened at a temperature in a range from 50° to 200 ° C.

7. The image receiving sheet according to claim 6, wherein said thermoplastic fine particles comprise polyethylene, polypropylene, polystyrene, polyvinyl acetate, polyvinyl chloride, polyethyl methacrylate, wax, ethylene-propylene copolymer, ethylene-vinyl-acetate copolymer, ethylene-ethylacrylate copolymer, ethylene-acrylic acid copolymer, ionomer, styrene-methacrylic acid ethylene copolymer, styrene-butadiene copolymer, or styrene-acryl copolymer.

8. The image receiving sheet according to claim 1, wherein the diameter of said thermoplastic fine particles is at least equal to 0.1 micrometers.

9. The image receiving sheet according to claim 8, wherein the diameter of said thermoplastic fine particles is in a range from 0.5 to 20 micrometers.

10. The image receiving sheet according to claim 1, wherein the coating amount of said thermoplastic fine particles to be provided on said transparent layer is in a range from 1 to 10 g/m².

11. The image receiving sheet according to claim 1, wherein the adhesion between said transparent layer and said thermoplastic fine particles layer is stronger than the adhesion of between said support member and said transparent layer.

12. The image receiving sheet according to claim 11, wherein the adhesion between a transferred medium and said thermoplastic fine particles layer is stronger than the adhesion of between said support member and said transparent layer when said thermoplastic fine particles are melted by heating and are adhered to said transferred medium.

* * * * *